(12) United States Patent
Lee

(10) Patent No.: US 6,400,298 B1
(45) Date of Patent: Jun. 4, 2002

(54) DIGITAL-TO-ANALOG CONVERTER WITH FAST SWITCHING AND PRECISE VOLTAGE CONVERSION

(75) Inventor: Seung-hoon Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/546,131

(22) Filed: Apr. 10, 2000

(30) Foreign Application Priority Data

Aug. 5, 1999 (KR) .......................................... 99-32144

(51) Int. Cl.[7] .............................................. H03M 1/66
(52) U.S. Cl. ...................................................... 341/144
(58) Field of Search ................... 341/155, 144, 341/154, 146, 147, 148, 149

(56) References Cited

U.S. PATENT DOCUMENTS 5,831,566 A    11/1998   Ginetti ...................... 341/144
6,222,473 B1 *  4/2001   Castaneda et al. .......... 341/154

* cited by examiner

Primary Examiner—Brian Young
(74) Attorney, Agent, or Firm—Mills & Onello LLP

(57) ABSTRACT

A digital-to-analog converter capable of high-speed switching and precise voltage conversion is provided. The digital-to-analog converter for voltage-converting a digital input signal into an analog output voltage includes an auxiliary converter for determining the range of the analog output voltage, by controlling connection to a first or second reference voltage in response to a range control signal. Also, the digital-to-analog converter includes a main converter for changing the analog output voltage by controlling connection to the first or second reference voltage in response to the digital input signal for directing voltage conversion.

16 Claims, 7 Drawing Sheets

DIGITAL-TO-ANALOG CONVERTER WITH FAST SWITCHING AND PRECISE VOLTAGE CONVERSION

BACKGROUND OF THE INVENTION

1. Field of the Invention

The present invention relates to a digital-to-analog converter, and more particularly, to a digital-to-analog converter capable of fast switching of a digital input signal to an analog output voltage, and of precise voltage conversion.

2. Description of the Related Art

Digital-to-analog converters are used to convert a digital input signal to an analog output signal. The simplest technique used in a digital-to-analog converter is to use serially-connected resistors for dividing a voltage into multiple stages, between two power supply voltages. One of the digital-to-analog converters using this technique is disclosed in U.S. Pat. No. 5,831,566.

In U.S. Pat. No. 5,831,566, a plurality of resistors connected to each other in series are provided, and a plurality of switches, which are controlled by the output of a decoder for decoding a digital input signal, connect nodes between resistors to a power supply voltage VDD or a ground voltage VSS. Consequently, an analog output voltage is generated and output to the node of a resistor fixed to an analog output port. However, in U.S. Pat. No. 5,831,566, serial connection of resistors for dividing a voltage and outputting the divided voltages to an analog output port increases the resistance of the analog output port, so that switching to an analog output voltage is inevitably somewhat slow.

Digital-to-analog converters which can rapidly switch a digital input signal into an analog output voltage are desirable.

SUMMARY OF THE INVENTION

An object of the present invention is to provide a digital-to-analog converter which can rapidly switch a digital input signal into an analog output voltage.

To achieve the above object, an embodiment of the present invention provides a digital-to-analog converter (DAC) for voltage-converting a digital input signal into an analog output voltage. The DAC of the invention includes an auxiliary converter for determining the range of the analog output voltage by controlling connection to a first or second reference voltage in response to a range control signal. The DAC also includes a main convener for changing the analog output voltage by controlling connection to the first or second reference voltage in response to the digital input signal for directing voltage conversion.

In one embodiment, in the DAC of the invention, the auxiliary converter includes a resistor connected to the analog output voltage. A switch unit determines whether the resistor is to be connected to the first reference voltage or the second reference voltage, in response to the range control signal.

The main converter can include a decoder which decodes the digital input signal to direct voltage conversion. In one embodiment, the decoder is a binary-to-thermometer decoder in which the output code has a minimum code change. A resistor array of the main converter includes a plurality of resistors arranged in parallel, each of which is connected at a first end to the analog output voltage. A switch unit determines whether the other end of each resistor is to be connected to the first reference voltage or the second reference voltage in response to an in output code tot the decoder. In one embodiment, each of the resistors in the array has the same resistance. In an alternative embodiment, the resistors have binary-weighted resistances. In this embodiment, the on resistance of the switch unit is reduced according to a binary-weighted ratio of the resistors in the array.

In another aspect, the present invention provides a DAC for converting the voltage of a digital input signal into an analog output voltage. The DAC of this aspect includes an auxiliary converter for determining the range of the analog output voltage by controlling connection to a first or second reference voltage in response to a range control signal. To direct signal conversion, a main converter divides the digital input signal into upper bit digital input signals and lower bit digital input signals. The main converter changes the analog output voltage in response to the lower bit digital input signal with a first resistor array having a resistance that is a binary-weighted unit resistance, and changes the analog output voltage in. response to the upper bit digital input signal with a second resistor array having the same unit resistances.

In one embodiment of this aspect of the invention, in the main converter, the resistors in the first resistor array are coupled to the first or second reference voltage in direct response to the lower bit digital input signal, and the resistors in the second resistor array are coupled to the first or second reference voltage in response to the output code of a decoder which responds to the upper bit digital input signal. In another embodiment of this aspect, the resistors in the first resistor array are coupled to the first or second reference voltage in response to the output code of a decoder which responds to the lower bit digital input signal, and the resistors in the second resistor array are coupled to the first or second reference voltage in response to the output code of a decoder which responds to the upper bit digital input signal. In either of these particular embodiments, the decoder can be a binary-to-thermometer decoder n which the output code has a minimum code change.

In still another aspect, the present invention provides a DAC for converting the voltage of a digital input signal into an analog output voltage. The DAC of this aspect includes an auxiliary converter for determining the output voltage range of the analog output port of the DAC by controlling connection to a first or second reference voltage in response to a range control signal. To direct voltage conversion, a main converter divides the digital input signals into row-direction bit digital input signals and column-direction bit digital input signals. The main converter changes the analog output voltage by resistor-switching cells which respond to the output code of a column decoder to decode the column-direction bit digital input signal and the output code of a row decoder to decode the row -direction bit digital input signal.

In one embodiment of this aspect of the invention, each of the column decoder and the row decoder is a binary-to-thermometer decoder in which the output code has a minimum code change.

Each of the resistor-switching cells can include a local decoder responsive to the output codes of the column decoder and row decoder. A resistor is coupled to the analog output voltage, and a cell switch unit connects the resistor to the first or second reference voltage in response to the output of the localdecoder.

Each of the resistor-switching cells can have a matrix structure in which the cells are arranged in rows and columns in accordance with the number of output codes of the row decoder and the number of output codes of the column decoder.

Such a digital-to-analog converter according to the present invention can achieve fast switching and precise conversion of a digital input signal into an analog output voltage, and diversify the range of an analog output voltage.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS OF THE INVENTION

Figure 1:
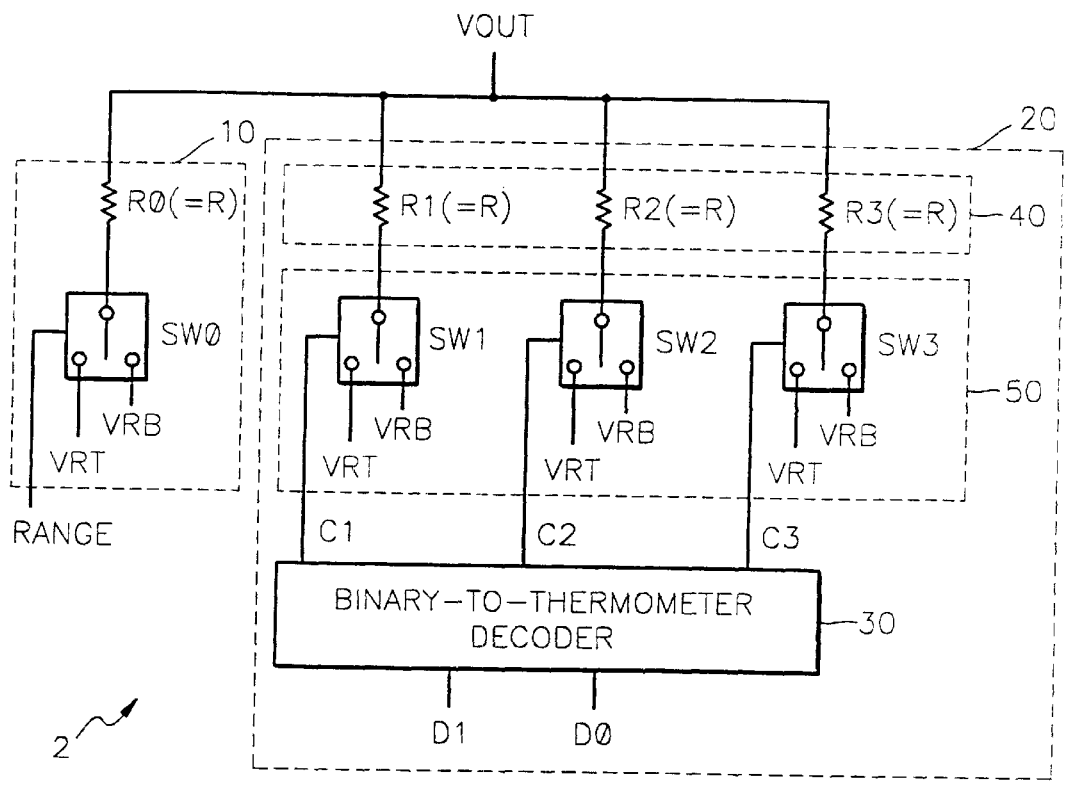
FIG. 1 is a schematic block diagram illustrating a digital-to-analog converter (DAC) according to a first embodiment of the present invention.

Referring to FIG. 1, a digital-to-analog converter (DAC) 2 according to a first embodiment of the present invention includes an auxiliary converter 10 for setting the voltage range of an output voltage VOUT which is the output of the DAC 2, and a main converter 20 for generating the analog output voltage VOUT having a predetermined voltage range.

The auxiliary converter 10 includes a switch unit SW0 and a resistor R0. The switch unit SW0 connects one port of the resistor R0 to a first reference voltage VRT or a second reference voltage VRB, in response to a range control signal RANGE for setting the output voltage range of the analog output voltage VOUT. The first and second reference voltages VRT and VRB can be set and/or varied. The present specification describes the case in which the first reference voltage VRT is set to be higher than the second reference voltage VRB.

Figure 2:
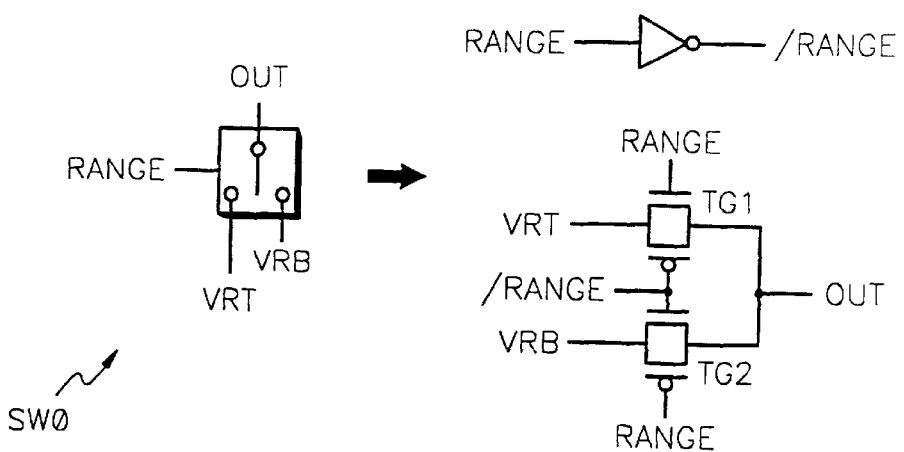
FIG. 2 is a schematic circuit diagram illustrating one embodiment of a switch unit in the auxiliary converter of FIG. 1.
Figure 3:
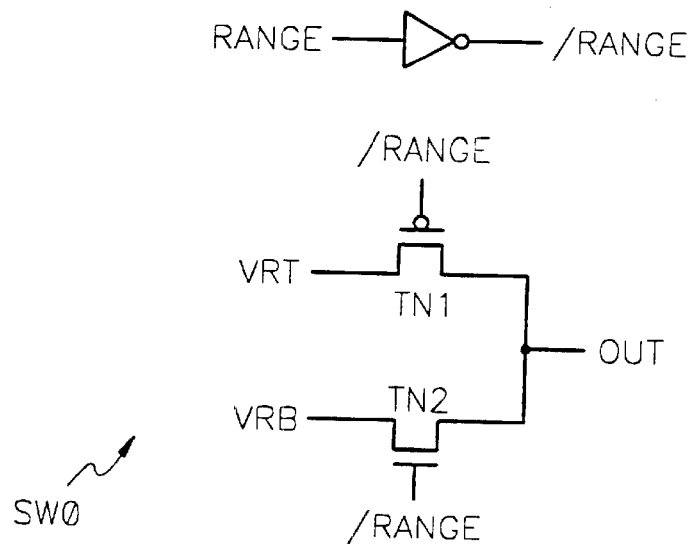
FIG. 3 is a schematic circuit diagram illustrating another embodiment of a switch unit shown in FIG. 2.

The switch unit SW0 in the auxiliary converter 10 is shown in FIGS. 2 and 3. Referring to FIG. 2, the switch unit SW0 connects its output OUT to the first or second reference voltage VRT or VRB in response to the range control signal RANGE. That is, a transmission gate TG1 is turned on in response to a logic high level of the range control signal RANGE, and thus the output OUT of the switch unit SW0 is connected to the first reference voltage VRT. On the other hand, a transmission gate TG2 is turned on in response to a logic low level of the range control signal RANGE, and thus the output OUT of the switch unit SW0 is connected to the second reference voltage VRB.

FIG. 3, which shows another example of the switch unit SW0 of FIG. 2, is almost the same as the switch unit SW0 of FIG. 2 in operation. In the switch unit of FIG. 3, a transistor TN1 is turned on in response to the logic high level of the range control signal RANGE, so that the output OUT of the switch unit SW0 is connected to the first reference voltage VRT. On the other hand, a transistor TN2 is turned on in response to the logic low level of the range control signal RANGE, so that the output OUT of the switch unit SW0 is connected to the second reference voltage VRB.

Referring back to FIG. 1, in the auxiliary converter 10, one port of the resistor R0 is connected to the first reference voltage VRT in response to the logic high level of the range control signal RANGE in accordance with the operation of the above-described switch unit SW0, so that the analog output port VOUT, which is the other port of the resistor R0, receives the first reference voltage VRT. Also, one port of the resistor R0 is connected to the second reference voltage VRB in response to the logic low level of the range control signal RANGE, so that the analog output port VOUT receives the second reference voltage VRB. Thus, in the auxiliary converter 10, the maximum output voltage of the analog output voltage VOUT is controlled to be the first reference voltage VRT, in response to the logic high level of the range control signal RANGE, and the minimum output voltage of the analog output voltage VOUT is controlled to be the second reference voltage VRB, in response to the logic low level of the range control signal RANGE. Consequently, it can be said that the output voltage range in the auxiliary converter 10 is shifted by 1 LSB in response to the range control signal RANGE.

In response to a digital input signal, the main converter 20 generates an analog output voltage VOUT which is within the output voltage range generated by the auxiliary converter 10. This voltage range varies while connection to the first or second reference voltage VRT or VRB is controlled in response to digital input signals D1 and D0 for commanding voltage conversion of a digital input into an analog output.

The main converter 20 includes a decoder 30 for decoding the digital input signals D1 and D0, a resistor array 40 in which a plurality of resistors Ri (where, for example, i is 1 to 3, as shown) are arranged in parallel, and a switch unit 50 for determining whether one port of each of the resistors Ri is to be connected to the first reference voltage VRT or the second reference voltage VRB, in response to the output code of the decoder 30. Here, the other ports of the resistors Ri are connected together, and become the analog output terminal VOUT which is connected to the output of the auxiliary converter 10.

Figure 4:
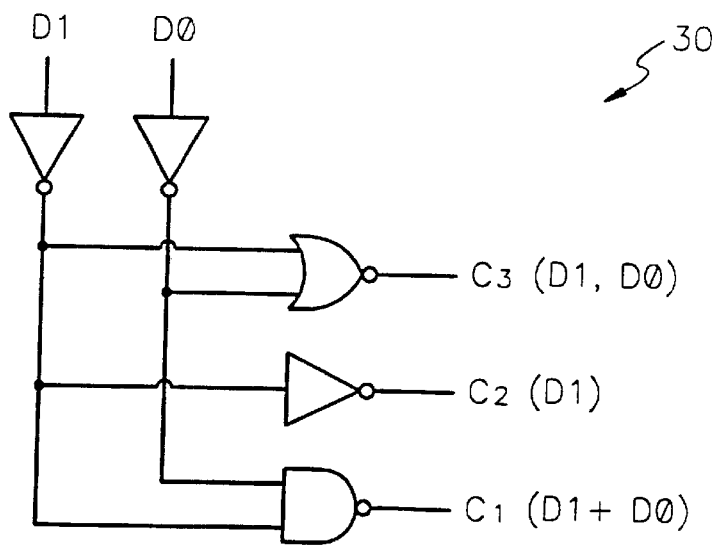
FIG. 4 is a schematic circuit diagram illustrating one embodiment of the binary-to-thermometer decoder shown in FIG. 1.

One embodiment of the decoder 30 is shown in FIG. 4. Referring to FIG. 4, the decoder 30 decodes a binary input value [D1:D0] and generates a corresponding output code [C3:C1].

The output code [C3:C1] in response to a varying binary input value [D1:D0] is set to be minimally coded from a previous output code [C3:C1]. It is preferable that the decoder 30 is realized as a binary-to-thermometer decoder.

To be more specific, in the decoder 30, when the binary input value [D1:D0] is "00", the output code [C3:C1] is "000", and when the next binary input value [D1:D0] increases to "01", the output code [C3:C1] becomes "001", that is, only one output code C1 is changed. Then, when the next binary input value [D1:D0] increases to "10", the output code [C3:C1] becomes "011", that is, only one output code C2 is changed compared to the previous output code [C3:C1] of "001". Finally, when the next binary input value [D1:D0] increases to "11", the output code [C3:C1] becomes "111", that is, only one output code C3 is changed compared to the previous output code [C3:C1] of "011".

In one embodiment, the resistor array 40 is formed by arranging a plurality of resistors Ri having the same resistance R in parallel. A first or second reference voltage VRT or VRB is applied to the resistors Ri by the switch unit 50.

The operation of the switch unit 50 is almost the same as that of the switch unit SW0 of FIG. 2 or 3, except that the switch units SW0 of FIGS. 2 and 3 are controlled in response to the range control signal RANGE, and the switch unit 50 in the main converter 20 is controlled in response to the output code of the decoder 30. When the decoder 30 outputs logic high codes [C3:C1], the switch unit 50 connects corresponding resistors Ri in the resistor array 40 to the first reference voltage VRT. When the decoder 30 outputs logic low codes [C3:C1], the switch unit 50 connects corresponding resistors Ri in the resistor array 40 to the second reference voltage VRB.

In the operation of the DAC 2, when the maximum voltage of the analog output voltage VOUT in the auxiliary converter 10 is set to be the first reference voltage VRT in response to the logic high level of the range control signal RANGE, the main converter 20 which operates in accordance with the output code [C3:C1] of the decoder 30 generates an analog output voltage VOUT which does not exceed the maximum output voltage, that is, the first reference voltage VRT.

In the first type of operation of the main converter 20, when the output code [C3:C1] of the decoder 30 is "000", resistors Ri in the resistor array 40 are connected to only the second reference voltage VRB, so that the second reference voltage VRB is loaded with a resistance $R_{VRB\_VOUT}$ of ⅓R. Here, ⅓R is obtained by connecting three resistances in parallel. In the auxiliary converter 10, the first reference voltage VRT is loaded with a resistance $R_{VRT\_VOUT}$ of R. Therefore, the voltage of the analog output port VOUT is connected in series to the second reference voltage VRB loaded with ⅓R, and to the first reference voltage VRT loaded with R. Thus, the analog output voltage VOUT is expressed by the following equation:

$$\frac{\frac{1}{3}R}{\left(\frac{1}{3}R+R\right)} \times (VRT - VRB) + VRB = \frac{VRT - VRB}{4} + VRB$$

In the second type of operation of the main converter 20, when the output code [C3:C1] of the decoder 30 is "001", resistors R1 and R2 in the resistor array 40 are connected to the second reference voltage VRB, and resistor R3 in the resistor array 40 is connected to the first reference voltage VRT. Thus, in the main converter 20, the second reference voltage VRB is loaded with a resistance $R_{VRB\_VOUT}$ of ½R which is obtained by connecting two resistors in parallel, and the first reference voltage VRT is loaded with a resistance $R_{VRT\_VOUT}$ of R. In the auxiliary converter 10, a resistance R is applied to the first reference voltage VRT. Consequently, the first reference voltage VRT is loaded with a total of resistance $R_{VRT\_VOUT}$ of ½R. Therefore, the voltage of the analog output port VOUT is connected in series to the second reference voltage VRB loaded with ½R and the first reference voltage VRT loaded with ½R. The analog output voltage VOUT is expressed by the following equation:

$$\frac{\frac{1}{2}R}{\left(\frac{1}{2}R+\frac{1}{2}R\right)} \times (VRT - VRB) + VRB = \frac{VRT - VRB}{2} + VRB$$

In the third type of operation of the main converter 20, when the output code [C3:C1] of the decoder 30 is "011", resistor R1 in the resistor array 40 is connected to the second reference voltage VRB, and resistors R2 and R3 are connected to the first reference voltage VRT. Thus, in the main converter 20, the second reference voltage VRB is loaded with a resistance $R_{VRB\_VOUT}$ of R, and the first reference voltage VRT is loaded with a resistance of ½R. In the auxiliary converter 10, the first reference voltage VRT is loaded with a resistance of R. Consequently, the first reference voltage VRT is loaded with a total of resistance $R_{VRT\_VOUT}$ of ⅓R. Therefore, the voltage of the analog output port VOUT is connected in series to the second reference voltage VRB loaded with R and the first reference voltage VRT loaded with ⅓R. The analog output voltage VOUT is expressed by the following equation:

$$\frac{R}{\left(\frac{1}{3}R+R\right)} \times (VRT - VRB) + VRB = \frac{(VRT - VRB) \times 3}{4} + VRB$$

In the last type of operation of the main converter 20, when the output code [C3:C1] of the decoder 30 is "111", resistors Ri in the resistor array 40 are connected to only the first reference voltage VRT, so that the first reference voltage VRT is loaded with a resistance of ⅓R which is obtained by connecting three resistors in parallel. In the auxiliary converter 10, the first reference voltage VRT is loaded with a resistance of R. Consequently, the first reference voltage VRT is loaded with a total of resistance $R_{VRT\_VOUT}$ of ¼R. Therefore, the analog output voltage VOUT is expressed by the first reference voltage VRT loaded with ¼R.

The operation of the DAC 2 in which the maximum voltage of the analog output voltage VOUT is set as the first reference voltage VRT, is summarized as shown in Table 1.

TABLE 1

| | | | | | R0 (connection to VRT) | | |
|---|---|---|---|---|---|---|---|
| D1 | D0 | C3 | C2 | C1 | $R_{VRT\_VOUT}$ | $R_{VRB\_VOUT}$ | VOUT |
| 0 | 0 | 0 | 0 | 0 | R | ⅓R | $\frac{VRT - VRB}{4} + VRB$ |
| 0 | 1 | 0 | 0 | 1 | ½R | ½R | $\frac{VRT - VRB}{2} + VRB$ |
| 1 | 0 | 0 | 1 | 1 | ⅓R | R | $\frac{(VRT - VRB) \times 3}{4} + VRB$ |
| 1 | 1 | 1 | 1 | 1 | ¼R | × | VRT |

The operation of the DAC 2 in which the minimum voltage of the analog output voltage VOUT is set to be the second reference voltage VRB, that is the minimum output voltage range, will now be described. When the minimum voltage of the analog output voltage VOUT in the auxiliary converter 10 is set to be the second reference voltage VRB in response to the logic low level of the range control signal RANGE, the main converter 20 which operates in accordance with the output code [C3:C1] of the decoder 30 generates an analog output voltage VOUT which is derived from the minimum output voltage determined by the auxiliary converter 10, that is, the second reference voltage VRB.

In the first type of operation of the main converter 20, when the output code [C3:C1] of the decoder 3 is "000", resistors Ri in the resistor array 40 are connected to only the second reference voltage VRB, so that the second reference voltage VRB is loaded with a resistance $R_{VRB\_VOUT}$ of ⅓R which is obtained by connecting three resistances in parallel. In the auxiliary converter 10, the second reference voltage VRB is loaded with a resistance of R. Consequently, the second reference voltage VRB is loaded with a total of resistance $R_{VRB\_VOUT}$ of ¼R. The analog output voltage VOUT is expressed by the first reference voltage VRT loaded with ¼R.

In the second type of operation of the main converter 20, when the output code [C3:C1] of the decoder 3 is "001", resistors R1 and R2 in the resistor array 40 are connected to the second reference voltage VRB, and a resistor R3 therein is connected to the first reference voltage VRT. Thus, in the main converter 20, the second reference voltage VRB is loaded with a resistance $R_{VRB\_VOUT}$ of ½R, and the first reference voltage VRT is loaded with a resistance $R_{VRT\_VOUT}$ of R. In the auxiliary converter 10, the second reference voltage VRB is loaded with a resistance of R. Consequently, the second reference voltage VRB is loaded with a total of resistance $R_{VRB\_VOUT}$ of ⅓R. Therefore, the analog output voltage VOUT is given by a serial relationship in which the first reference voltage VRT is loaded with R, and the second reference voltage VRB is loaded with ⅓R, as shown in the following Equation:

$$\frac{\frac{1}{3}R}{\left(\frac{1}{3}R + R\right)} \times (VRT - VRB) + VRB = \frac{VRT - VRB}{4} + VRB$$

In the third type of operation of the main converter 20, when the output code [C3:C1] of the decoder 3 is "011", a resistor R1 in the resistor array 40 is connected to the second reference voltage VRB, and resistors R2 and R3 in the resistor array 40 are connected to the first reference voltage VRT. Thus, in the main converter 20, the second reference voltage VRB is loaded with a resistance $R_{VRB\_VOUT}$ of R, and the first reference voltage VRT is loaded with a resistance $R_{VRT\_VOUT}$ of ½R. In the auxiliary converter 10, the second reference voltage VRB is loaded with a resistance of R. Hence, so that the second reference voltage VRB is loaded with a total of resistance $R_{VRB\_VOUT}$ of ½R. Therefore, the analog output voltage VOUT is given by a serial relationship in which the second reference voltage VRB is loaded with ½R, and the first reference voltage VRT is loaded with ½R, as shown in the following equation:

$$\frac{\frac{1}{2}R}{\left(\frac{1}{2}R + \frac{1}{2}R\right)} \times (VRT - VRB) + VRB = \frac{VRT - VRB}{2} + VRB$$

In the last type of operation of the main converter 20, when the output code [C3:C1] of the decoder 30 is "111", resistors Ri in the resistor array 40 are connected to only the first reference voltage VRT, so that the first reference voltage VRT is loaded with a resistance of ⅓R which is obtained by connecting three resistors in parallel. In the auxiliary converter 10, the second reference voltage VRB is loaded with a resistance $R_{VRB\_VOUT}$ of R. Therefore, the analog output voltage VOUT is given by a serial relationship with the second reference voltage VRB is loaded with R, and the first reference voltage VRT is loaded with ⅓R. The analog output voltage VOUT is expressed by the following equation:

$$\frac{R}{\left(\frac{1}{3}R+R\right)} \times (VRT - VRB) + VRB = \frac{(VRT - VRB) \times 3}{4} + VRB$$

The operation of the DAC 2 when the range control signal RANGE of the auxiliary converter 10 is at the logic low level, is summarized as shown in Table 2.

TABLE 2

| | | | | | R0 (connection to VRB) | | |
|---|---|---|---|---|---|---|---|
| D1 | D0 | C3 | C2 | C1 | $R_{VRT\_VOUT}$ | $R_{VRB\_VOUT}$ | VOUT |
| 0 | 0 | 0 | 0 | 0 | × | ¼R | VRB |
| 0 | 1 | 0 | 0 | 1 | R | ⅓R | $\frac{VRT - VRB}{4} + VRB$ |
| 1 | 0 | 0 | 1 | 1 | ½R | ½R | $\frac{VRT - VRB}{2} + VRB$ |
| 1 | 1 | 1 | 1 | 1 | ⅓R | R | $\frac{(VRT - VRB) \times 3}{4} + VRB$ |

In the DAC 2 according to the present embodiment, resistors are connected in parallel to the first and second reference voltages VRT and VRB with respect to the analog output voltage VOUT, such that the total resistance between the first and second reference voltages VRT and VRB, which is smaller than the total resistance of serially-connected resistors in a conventional DAC, is applied to the analog output port. Thus, the DAC 2 according to this embodiment enables rapid switching to the analog output voltage. Also, the DAC 2 uses resistors of the same size and switches of the same size, thus maximizing the linearity of the analog output voltage VOUT.

Figure 5:
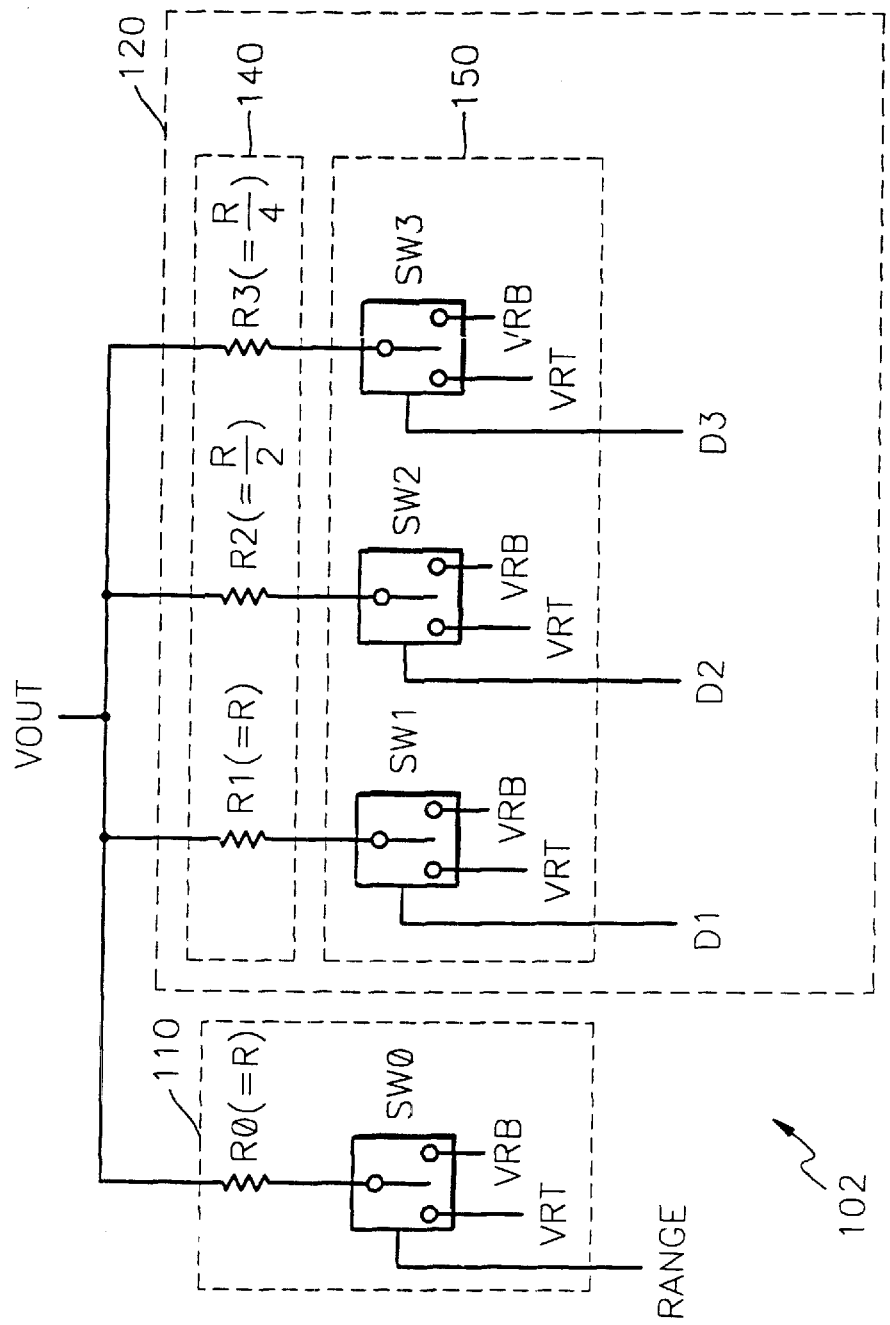
FIG. 5 is a schematic block diagram illustrating a DAC according to a second embodiment of the present invention.

Referring to FIG. 5, which shows a DAC according to a second embodiment of the present invention, the operation of a DAC 102 is almost the same as that of the DAC 2 of FIG. 1. However, the resistors Ri of a resistor array 40 in the main converter 20 of FIG. 1 have unit resistance values R, whereas resistors Ri of a resistor array 140 in a main converter 120 of FIG. 5 have resistances that are multiples of a unit resistance R by the reciprocals of $2^n$, that is, binary weighted resistances of $R/2^n$ (where n is 0, 1 or 2). A resistor R1 in the resistor array 140 has unit resistance R, a resistor R2 in the resistor array 140 has resistance R/2 which is the unit resistance multiplied by $1/2^1$, and a resistor R3 in the resistor array 140 has resistance R/4 which is the unit resistance multiplied by 1/2. The binary weighted resistance ($R/2^n$, n=0,1,2) can be obtained by reducing the length of a resistor having the unit resistance R to multiples of the reciprocal of 2 or by connecting a number of resistors having the unit resistance R to each other in parallel, the number corresponding to the index of the reciprocal of 2.

When the DAC 102 according to this embodiment uses the binary weighted resistance $R/2^n$ (where n is 0, 1 or 2) in the main converter 120, the sizes of switches SW1, SW2, and SW3 of a switch unit 150 in the main converter 120 must also be binary weighted to consider the on-resistance Ron of each of the switches SW1, SW2 and SW3. Since the total resistance connected to the switch SW1 is R+Ron, the total resistance connected to the switch SW2 must be set to be $$\frac{R + Ron}{2}$$

obtained by binary weighting the resistance of R+Ron, and the total resistance connected to the switch SW3 must be set to be $$\frac{R + Ron}{4}$$

obtained by binary weighting the resistance of R+Ron. Hence, the on-resistance of the switch SW2 is set to be $$\frac{Ron}{2},$$

and the on-resistance of the switch SW3 is set to be $$\frac{Ron}{4},$$

so that they are binary weighted with respect to the on-resistance Ron of the switch SW1.

The on-resistance values of the switches SW2 and SW3 can be binary weighted by varying the widths of MOS transistors within the switch unit SW0 as described above referring to FIGS. 2 and 3. The on-resistance of a MOS transistor is generally expressed by the following equation:

$$Ron = \frac{\mu_n \times Cox \times L}{(VGS - VTH) \times W}$$

wherein $\mu_n$ denotes the mobility of electrons, Cox denotes the capacitance of a gate oxide layer, L denotes the length of a channel, VGS denotes the difference between the voltages of a gate and a source, VTH denotes a threshold voltage, and W denotes the width of a channel. Therefore, the on-resistance values of the switches SW2 and SW3 can be binary weighted by increasing the width of a channel, W.

Signals for controlling the switch unit 50 of FIG. 1 are provided from the decoder 30 for decoding digital input signals Di (where i is 1, 2 or 3) which indicate voltage transformation of FIG. 1, whereas signals for controlling a switch unit 150 of FIG. 5, that is, digital input signals Di are directly provided.

In the DAC 102, when the maximum voltage of the analog output voltage VOUT is set to be a first reference voltage VRT, the first reference voltage VRT and the analog output voltage VOUT are connected by a resistance $R_{VRT\_VOUT}$ which is a value obtained by connecting in parallel a resistor R0, which is connected to the first reference voltage VRT in the auxiliary converter 110, to resistors Ri in the main converter 120 which are connected to the first reference voltage VRT in response to the digital input signals Di. Also, the second reference voltage VRB and the analog output voltage VOUT are connected by a resistance $R_{VRB\_VOUT}$ which is a value obtained by connecting in parallel resistors Ri in the main converter 120 which are connected to the second reference voltage VRB in response to the digital input signals Di. Therefore, the analog output voltage VOUT in the DAC 102 is the sum of the second reference voltage VRB and voltages obtained by dividing the difference (VRT−VRB) between the first reference voltage VRT and the second reference voltage VRB and allocating the divided voltages to the resistance $R_{VRB\_VOUT}$ between the analog output voltage VOUT and the second reference voltage VRB.

The operation of the DAC 102 in which the minimum voltage of the analog output voltage VOUT is set to be the first reference voltage VRT is summarized as shown in Table 3.

TABLE 3

| | | | R0 (connection to VRT) | | |
|---|---|---|---|---|---|
| D3 | D2 | D1 | $R_{VRT\_VOUT}$ | $R_{VRB\_VOUT}$ | VOUT |
| 0 | 0 | 0 | R | ½R | $\frac{VRT-VRB}{8} + VRB$ |
| 0 | 0 | 1 | ½R | ⅙R | $\frac{VRT-VRB}{4} + VRB$ |
| 0 | 1 | 0 | ⅓R | ⅕R | $\frac{VRT-VRB}{8} \times 3 + VRB$ |
| 0 | 1 | 1 | ¼R | ¼R | $\frac{(VRT-VRB)}{2} + VRB$ |
| 1 | 0 | 0 | ⅕R | ⅓R | $\frac{VRT-VRB}{8} \times 5 + VRB$ |
| 1 | 0 | 1 | ⅙R | ½R | $\frac{VRT-VRB}{4} \times 3 + VRB$ |
| 1 | 1 | 0 | ⅐R | R | $\frac{VRT-VRB}{8} \times 7 + VRB$ |
| 1 | 1 | 1 | ⅛R | × | VRT |

In the DAC 102, when the minimum voltage of the analog output voltage VOUT is set to be a second reference voltage VRB, the first reference voltage VRT and the analog output voltage VOUT are connected by a resistance $R_{VRT\_VOUT}$ which is a value obtained by connecting in parallel resistors Ri in the main converter 120 which are connected to the first reference voltage VRT, in response to the digital input signals Di. Also, the second reference voltage VRB and the analog output voltage VOUT are connected by a resistance $R_{VRB\_VOUT}$ which is a value obtained by connecting in parallel a resistor R0 in the auxiliary converter 110, which is connected to the second reference voltage VRB, to resistors Ri in the main converter 120 which are connected to the second reference voltage VRB, in response to the digital input signals Di. Therefore, the analog output voltage VOUT in the DAC 102 is the sum of the second reference voltage VRB and voltages obtained by dividing the difference (VRT−VRB) between the first reference voltage VRT and the second reference voltage VRB and allocating the divided voltages to the resistance $R_{VRB\_VOUT}$ between the analog output voltage VOUT and the second reference voltage VRB.

The operation of the DAC 102 in which the minimum voltage of the analog output voltage VOUT is set to be the second reference voltage VRB is summarized as shown in Table 4.

TABLE 4

| | | | R0 (connection to VRB) | | |
|---|---|---|---|---|---|
| D3 | D2 | D1 | $R_{VRT\_VOUT}$ | $R_{VRB\_VOUT}$ | VOUT |
| 0 | 0 | 0 | × | ⅛R | VRB |
| 0 | 0 | 1 | R | ½R | $\frac{VRT-VRB}{8} + VRB$ |
| 0 | 1 | 0 | ½R | ⅙R | $\frac{VRT-VRB}{4} + VRB$ |
| 0 | 1 | 1 | ⅓R | ⅕R | $\frac{VRT-VRB}{8} \times 3 + VRB$ |
| 1 | 0 | 0 | ¼R | ¼R | $\frac{(VRT-VRB)}{2} + VRB$ |
| 1 | 0 | 1 | ⅕R | ⅓R | $\frac{VRT-VRB}{8} \times 5 + VRB$ |
| 1 | 1 | 0 | ⅙R | ½R | $\frac{VRT-VRB}{4} \times 3 + VRB$ |
| 1 | 1 | 1 | ⅐R | R | $\frac{VRT-VRB}{8} \times 7 + VRB$ |

Therefore, the DAC 2 of FIG. 1 includes resistors (R1=R2=R3=R) each having a unit resistance R and switches ($SW0_{Ron}=SW1_{Ron}=SW2_{Ron}=SW3_{Ron}$) each having the same on-resistance Ron, whereas the DAC 102 according to this embodiment includes resistors R1, R2 and R3 in the main converter 120 having resistances obtained by binary weighting the unit resistance R, ($R/2^n$, n=0,1,2), and switches SW1, SW2 and SW3 having binary weighted on-resistances Ron, Ron/2, and Ron/4, respectively. Also, the DAC 2 of FIG. 1 includes a binary-to-thermometer decoder, while the DAC 102 according to this embodiment does not require the binary-to-thermometer decoder. Thus, the DAC 102 is realized with a minimum number of elements, so that its area is down-sized. Furthermore, the total resistance with which the first reference voltage VRT is loaded is the same as that with which the second reference voltage VRB is loaded as in the DAC 2 of FIG. 1, thus enabling high-speed switching to an analog output voltage.

Figure 6:
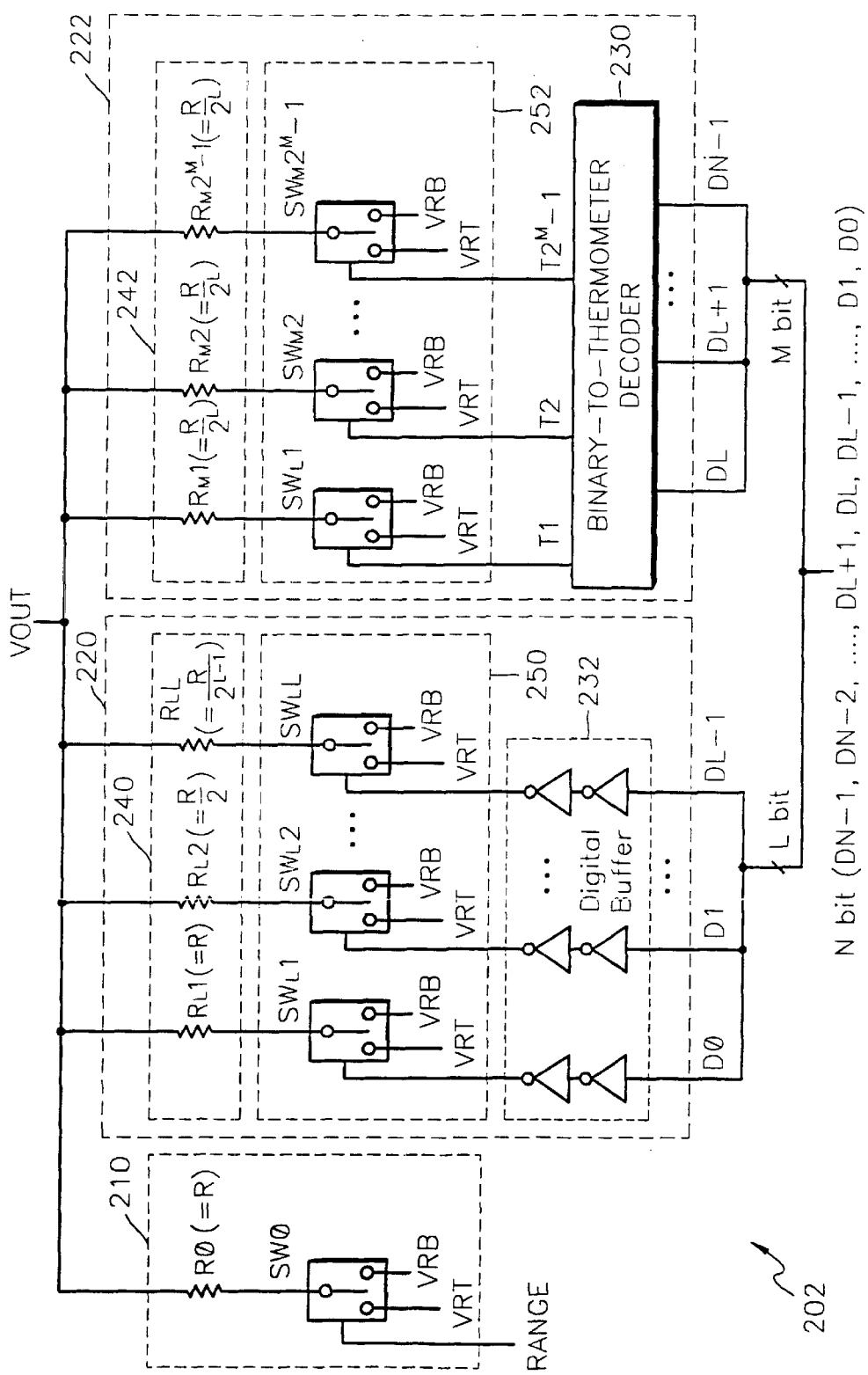
FIG. 6 is a schematic block diagram illustrating a DAC according to a third embodiment of the present invention.

FIG. 6 shows a DAC 202 according to a third embodiment of the present invention. Referring to FIG. 6, the DAC 202 is a combination of the DACs 2 and 102 of FIGS. 1 and 2, to be more specific, a combination of the main converter 20 of FIG. 1 and the main and auxiliary converters 110 and 120 of FIG. 5.

In the DAC 202, an N-bit digital input signal Di (where i is 0, 1, ..., L−1, L, L+1, ..., N−1) for directing voltage transformation is divided into an L lower bit digital input signal Di (where i is 0, 1, ..., L−1) and an M upper bit digital input signal Di (where i is L, L+1, ..., N−1). The L lower bit digital input signals D0, D1, ..., DL−1 are provided to a first main converter 220 which includes a resistor array 240 having resistances $R/2^n$ (where n is an integer between 1 and L−1) that are multiples of a unit resistance $R_L1(=R)$ by the reciprocals of $2^n$, that is, binary weighted resistances. The M upper bit digital input signals DL, DL+1, ..., DN−1 are provided to a second main converter 222 which is connected to a resistor array 242 having resistances $R/2^L$ that are the same as unit resistance $R_M1(=R/2^L)$.

The DAC 202 operates by combining the operations of the DAC 2 of FIG. 1 and the DAC 102 of FIG. 5. In this embodiment, the DAC 202 will not be described in detail to avoid duplication of explanation.

In the DAC 202, when a maximum voltage of an analog output voltage VOUT is set to be the first reference voltage VRT, the resistance between the first reference voltage VRT and the analog output voltage VOUT is obtained by connecting a resistor R0, resistors $R_L i$ (where i is an integer between 1 and L) within a first main converter 220, and parallel-connected resistors $R_M i$ (where i is an integer between 1 and $2^{M-1}$) within a second main converter 222 to each other in parallel. The resistor R0 is connected to the first reference voltage VRT of an auxiliary converter 210. The resistors $R_L i$ (where i is an integer between 1 and L) within the first main converter 220 are connected to the first reference voltage VRT in response to the L lower bit digital input signals D0, D1, ..., DL−1. The parallel-connected resistors $R_M i$ (where i is an integer between 1 and $2^{M-1}$) within the second main converter 222 are connected to the first reference voltage VRT in response to the output codes Ti (where i is an integer between 1 and $2^{M-1}$) of a decoder 230 which responds to M upper bit digital input signals DL, DL+1, ..., DN−1. The resistance between the second reference voltage VRB and the analog output voltage VOUT is obtained by connecting the resistors $R_L i$ (where i is an integer between 1 and L) in the first main converter 220 to resistors $R_M i$ (where i is an integer between 1 and $2^{M-1}$) in the second main converter 222 in parallel. The resistors $R_L i$ (where i is an integer between 1 and L) within the first main converter 220 are connected to the second reference voltage VRB in response to the L lower bit digital input signals D0, D1 ..., DL−1. The resistors $R_M i$ (where i is an integer between 1 and $2^{M-1}$) within the second main converter 222 are connected to the second reference voltage VRB in response to the output codes Ti (where i is an integer between 1 and $2^{M-1}$) of the decoder 230 which responds to the M upper bit digital input signals DL, DL+1, ..., DN−1. Therefore, the analog output voltage VOUT of the DAC 202 is the sum of the second reference voltage VRB and voltages obtained by dividing the difference between the first reference voltage VRT and the second reference voltage VRB, and allocating the divided voltages to resistors between the analog output port VOUT and the second reference voltage VRB.

The DAC 202 according to this embodiment as described above includes the linearity of the analog output voltage of the DAC 2 of FIG. 1, the effect of a reduction of glitch energy, and the effect of a reduction in the area of the DAC 202 of FIG. 5, thus increasing the precision of the analog output voltage and minimizing current consumption.

Figure 7:
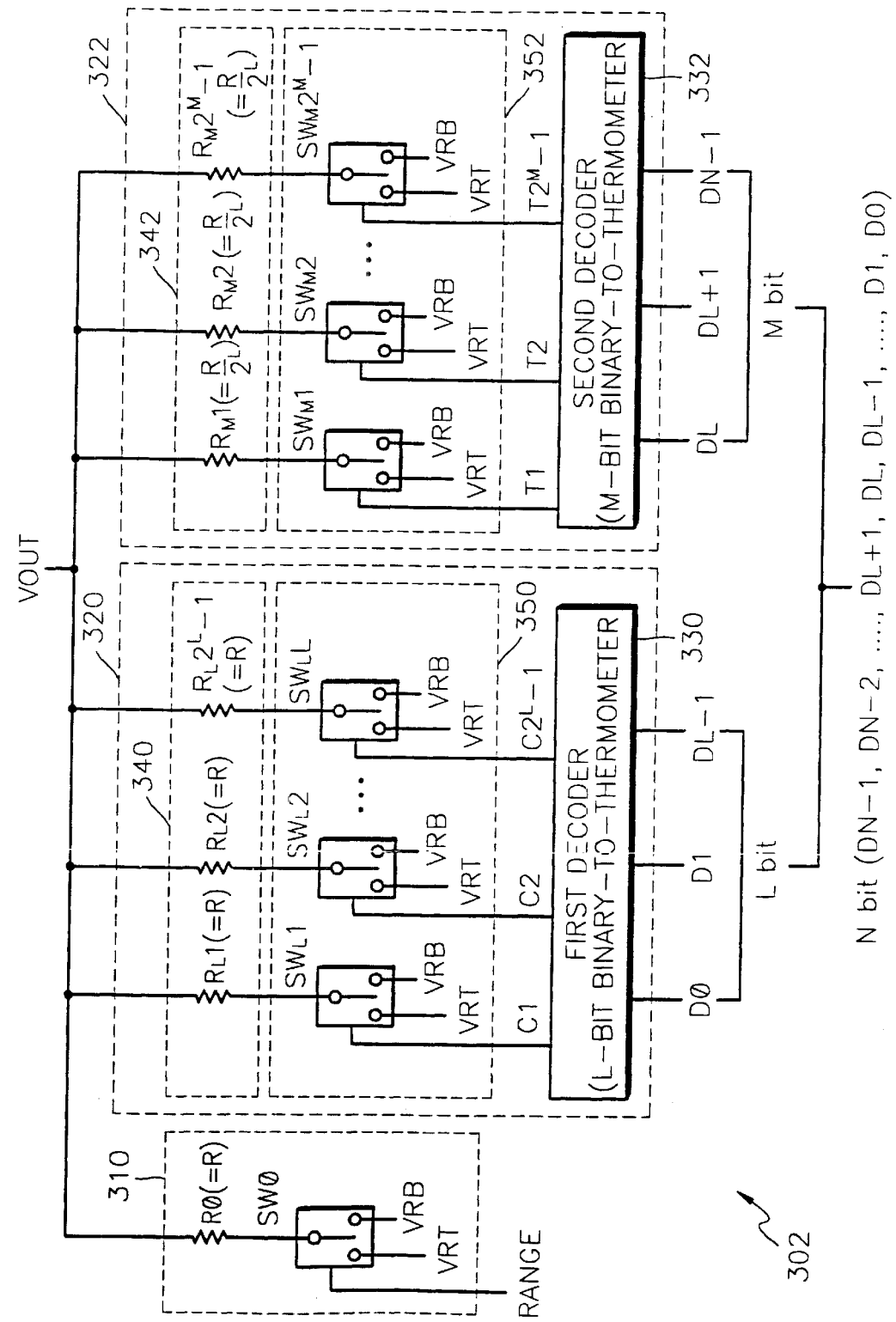
FIG. 7 is a schematic block diagram illustrating a DAC according to a fourth embodiment of the present invention.

FIG. 7 illustrates a DAC 302 according to a fourth embodiment of the present invention. Referring to FIG. 7, the operation of the DAC 302 is almost the same as that of the DAC 202 of FIG. 6 except that the DAC 302 includes a first main converter 320 including a resistor array 340 having unit resistances $R_L1$ (=R), instead of the first main converter 220 connected to the resistor array 240 having resistances $R/2^n$ (where n is an integer between 1 and L−1), which are multiples of unit resistance $R_L1$ (=R) by the reciprocals of $2^n$, that is, binary weighted resistances.

The first and second main converters 320 and 322 in the DAC 302 operate in similar fashion to the operation of the DAC 2 of FIG. 1. In this embodiment, the DAC 302 will not be described in detail to avoid duplication of explanation.

In the DAC 302, when a maximum output voltage of an analog output voltage VOUT is set to be the first reference voltage VRT, the resistance between the first reference voltage VRT and the analog output voltage VOUT is obtained by connecting a resistor R0, resistors $R_L i$ (where i is an integer between 1 and $2^{L-1}$) within a first main converter 320, and resistors $R_M j$ (where j is an integer between 1 and $2^{M-1}$) within a second main converter 322 to each other in parallel. The resistor R0 is connected to the first reference voltage VRT of an auxiliary converter 310. The resistors $R_L i$ (where i is an integer between 1 and $2^{L-1}$) within the first main converter 320 are connected to the first reference voltage VRT in response to the output codes Ci (where i is an integer between 1 and $2^{L-1}$) of a first decoder 330 which responds to L lower bit digital input signals D0, D1, ..., DL−1. The resistors $R_M j$ (where j is an integer between 1 and $2^{M-1}$) within the second main converter 322 are connected to the first reference voltage VRT in response to the output codes Ti (where i is an integer between 1 and $2^{M-1}$) of a second decoder 332 which responds to M upper bit digital input signals DL, DL+1, ..., DN−1. The resistance between the second reference voltage VRB and the analog output voltage VOUT is obtained by connecting the resistors $R_L i$ (where i is an integer between 1 and $2^{L-1}$) in the first main converter 320 and the resistors $R_M j$ (where j is an integer between 1 and $2^{M-1}$) in the second main converter 322 to each other in parallel. The resistors $R_L i$ (where i is an integer between 1 and $2^{L-1}$) within the first main converter 320 are connected to the second reference voltage VRB in response to the output codes Ci (where i is an integer between 1 and $2^{L-1}$) of the first decoder 330 which responds to the L lower bit signals D0, D1, ..., DL−1 for directing voltage conversion. The resistors $R_M j$ (where j is an integer between 1 and $2^{M-1}$) within the second main converter 322 are connected to the second reference voltage VRB in response to the output codes Ti (where i is an integer between 1 and $2^{M-1}$) of the second decoder 332 which responds to the M upper bit signals DL, DL_1, ..., DN−1 for directing voltage conversion. Therefore, the analog output voltage VOUT of the DAC 302 is the sum of the second reference voltage VRB and voltages obtained by dividing the difference of the first reference voltage VRT and the second reference voltage, and allocating the divided voltages to resistors between the analog output port VOUT and the second reference voltage VRB.

In the DAC 302 according to this embodiment, the L lower bits and the M upper bits are respectively connected to the resistor arrays 340 and 342, the resistor array 340 including resistors $R_L i$ (where i is an integer between 1 and $2^{L-1}$) each having the unit resistance (=R) of a resistor $R_L 1$ and the resistor array 342 including resistors $R_M j$ (where j is an integer between 1 and $2^{M-1}$) each having the resistance (=R/2) of a resistor $R_M 1$. Here, R/2 is the product of the unit resistance R by the reciprocal of 2. Therefore, the DAC 302 can easily achieve the linearity of the analog output voltage.

Figure 8:
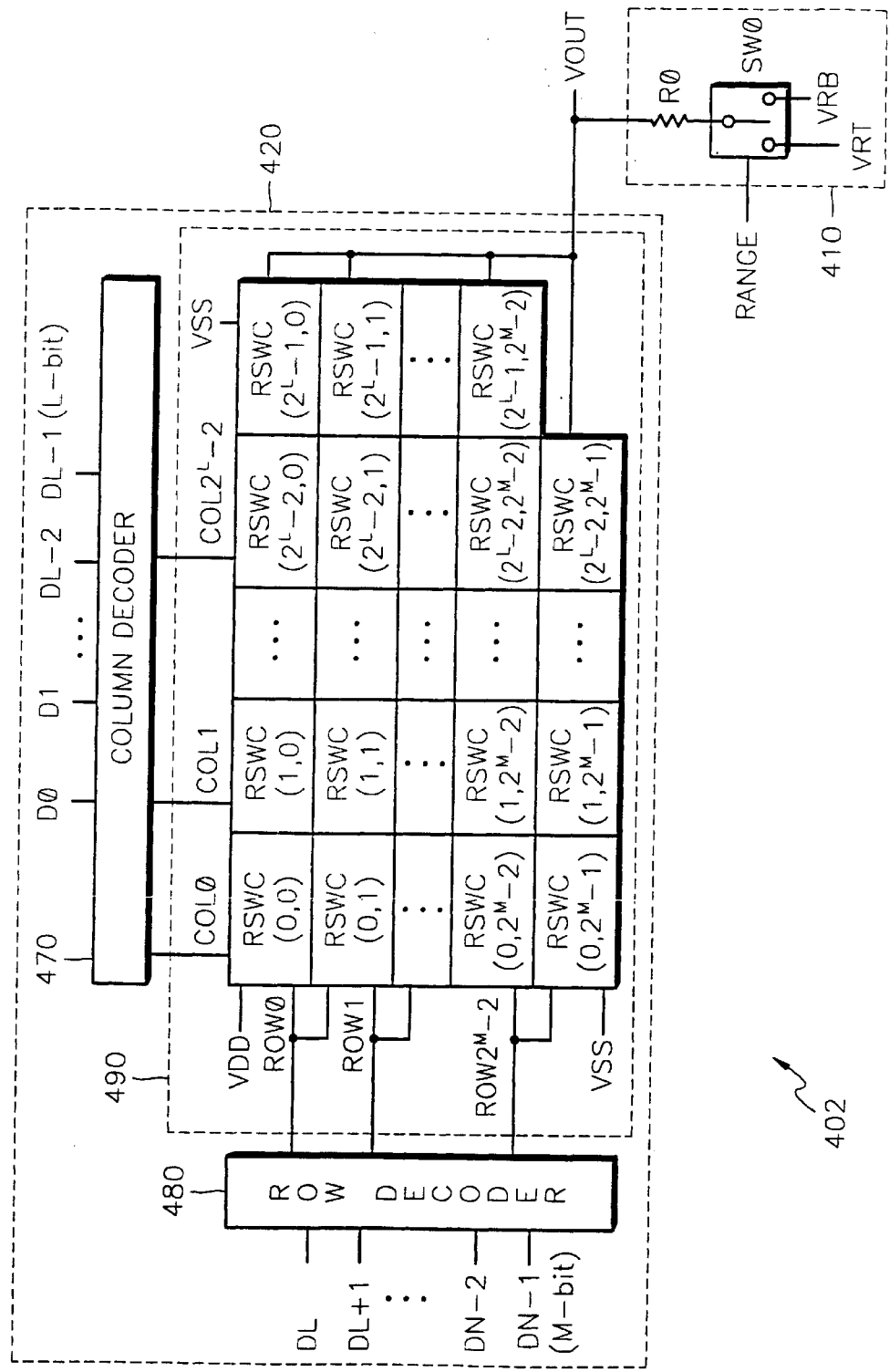
FIG. 8 is a schematic block diagram illustrating a DAC according to a fifth embodiment of the present invention.

FIG. 8 illustrates a DAC 402 according to a fifth embodiment of the present invention. Referring to FIG. 8, the DAC 402 includes an auxiliary converter 410 and a main converter 420 having resistor-switching cells (RSWCs) configured in a matrix structure. The operation of the auxiliary converter 410 is similar to that of the auxiliary converter 10 of FIG. 1, so this will not be described in detail to avoid duplication of explanation.

In the main converter 420, N-bit digital input signals D0, D1, . . . ,DL−1, DL, DL+1, . . . , and DN−1 for directing voltage conversion are classified into L bit column-direction digital input signals D0, D1, . . . , and DL−1 and Mbit row-direction digital input signals DL, DL+1, . . . , and DN−1, and the L bits of column-direction digital input signals D0, D1, . . . , and DL−1 are provided to a column decoder 470, and the M bits of row-direction digital input signals DL, DL+1, . . . , and DN−1 are provided to a row decoder 480. Preferably, the column decoder 470 and the row decoder 480 are the binary-to-thermometer decoder 30 of FIG. 4. The main converter 420 has a matrix structure in which RSWCs, which respond to the output codes COLi and ROWj (where i is an integer between 0 and $2^L-2$, and j is an integer between 0 and $2^M-2$) of the column decoder 470 and the row decoder 480, respectively, are arranged in rows and columns. Here, an RSWC is shown in FIG. 9.

Figure 9:
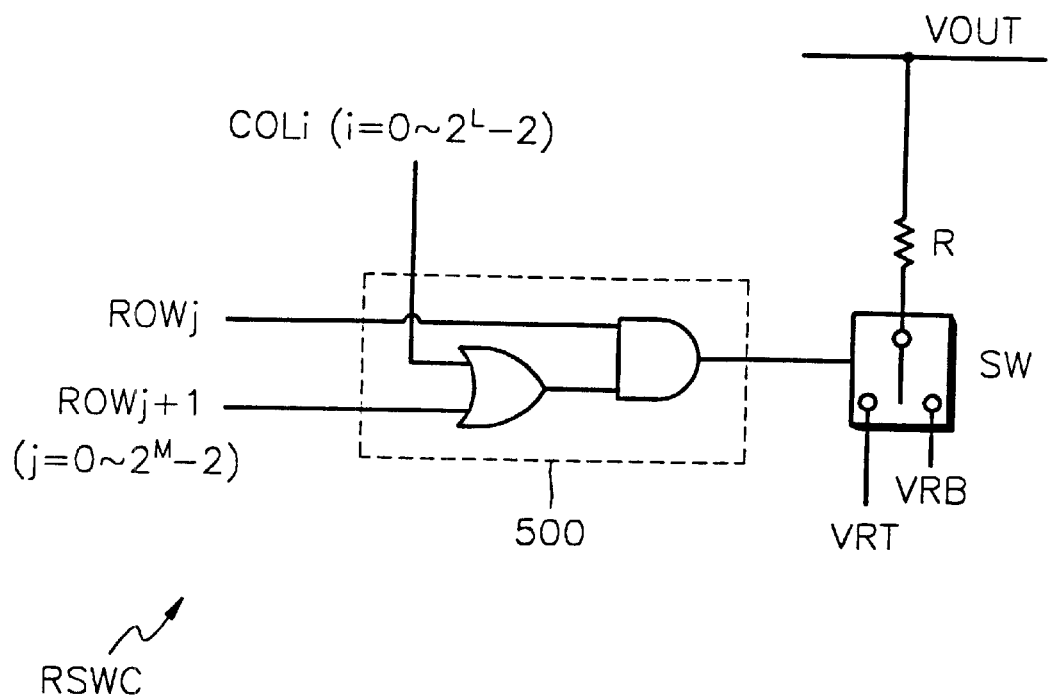
FIG. 9 is a schematic block diagram illustrating one embodiment of the resistance-switch cells shown in FIG. 8.

Referring to FIG. 9, the operation of the RSWC is similar to that of the auxiliary converter 10 of FIG. 1, except that a signal output by a local decoder 500, which responds to the output codes COLi (where i is an integer between 0 and $2^L-2$) of the column decoder 470 and the output codes ROWj (where j is an integer between 0 and $2^M-2$) of the row decoder 480 instead of the range control signal RANGE of FIG. 1, is provided to a cell switch unit SW.

The local decoder 500 determines whether a resistor R connected in series to the cell switch unit SW is to be connected to the first reference voltage VRT or the second reference voltage VRB, in response to an output code COLi of the column decoder 470 and two adjacent output codes ROWj and ROWj+1 of the row decoder 480. The operation of the RSWC will now be described with reference to the local decoder 500.

Firstly, when two output codes [ROWj:ROWj+1] of "10" from the row decoder 480 are applied to the local decoder 500, the RSWC connects the resistor R, which is connected in series to the cell switch unit SW, to the second reference voltage VRB in response to an output code COLi of "0" from the column decoder 470, or connects the resistor R to the first reference voltage VRT in response to an output code COLi of "1" from the column decoder 470.

Secondly, when two output codes [ROWj:ROWj+1] of "11" from the row decoder 480 are applied to the local decoder 500, the RSWC connects the resistor R, which is connected in series to the cell switch unit SW, to the first reference voltage VRT regardless of the output code COLi of the column decoder 470.

Lastly, when two output codes [ROWj:ROWj+1] of "01" or "00" from the row decoder 480 are applied to the local decoder 500, the RSWC connects the resistor R, which is connected in series to the cell switch unit SW, to the second reference voltage VRB regardless of the output code COLi of the column decoder 470.

Referring back to FIG. 8, in the operation of the DAC 402, first, when the maximum voltage of the analog output voltage VOUT in the auxiliary converter 410 is set to be the first reference voltage VRT, a resistance with which the first reference voltage VRT and the analog output voltage VOUT are loaded is obtained by coupling in parallel a resistor R0 which is connected to the first reference voltage VRT of the auxiliary converter 410, and resistors R which are connected to the first reference voltage VRT in the RSWCs in response to the output codes COLi and ROWj (where i is an integer between 0 and $2^L-2$, and j is an in integer between 0 and $2^M-2$) of the column decoder 470 and the row decoder 480. Also, the resistance with which the second reference voltage VRB and the analog output voltage VOUT are loaded is obtained by coupling in parallel resistors R which are connected to the second reference voltage VRB in the RSWCs in response to the output codes COLi and ROWj (where i is an integer between 0 and $2^L-2$, and j is an in integer between 0 and $2^M-2$) of the column decoder 470 and the row decoder 480. Therefore, the analog output voltage VOUT of the DAC 302 is the sum of the second reference voltage VRB and voltages obtained by dividing the difference of the first reference voltage VRT and the second reference voltage VRB, and allocating the divided voltages to resistors between the second reference voltage VRB and the analog output voltage VOUT.

Then, when the minimum voltage of the analog output voltage VOUT in the auxiliary converter 410 is set to be the second reference voltage VRB, a resistance with which the first reference voltage VRT and the analog output voltage VOUT are loaded is obtained by coupling in parallel resistors R which are connected to the first reference voltage VRT in the RSWCs in response to the output codes COLi and ROWj (where i is an integer between 0 and $2^L-2$, and j is an in integer between 0 and $2^M-2$) of the column decoder 470 and the row decoder 480. Also, the resistance with which the second reference voltage VRB and the analog output voltage VOUT are loaded is obtained by coupling in parallel a resistor R0 which is connected to the second reference voltage VRB in the auxiliary converter 410, to resistors R which are connected to the second reference voltage VRB in the RSWCs in response to the output codes COLi and ROWj (where i is an integer between 0 and $2^L-2$, and j is an in integer between 0 and $2^M-2$) of the column decoder470 and the row decoder 480. Therefore, the analog output voltage VOUT of the DAC 402 is the sum of the second reference voltage VRB and voltages obtained by dividing the difference of the first reference voltage VRT and the second reference voltage VRB, and allocating the divided voltages to resistors between the second reference voltage VRB and the analog output voltage VOUT.

The DAC 402 includes RSWCs responsive to the output codes COLi and ROWj (where i is an integer between 0 and $2^L-2$, and j is an in integer between 0 and $2^M-2$) of the column decoder470 and the row decoder 480 within the main converter 420, in which the number of RSWCs is the same as the number of output codes COLi and ROWj of the column decoder470 and the row decoder 480. A resistance obtained from resistors R in the RSWCs coupled to each other in parallel is shown at the analog output port. Therefore, in the DAC 402, the voltage range of conversion of a digital input signal into an analog output voltage can be widened, and the analog output voltage can be more precisely obtained.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A digital-to-analog converter for voltage-converting a digital input signal into an analog output voltage, comprising:

a first converter section for determining a range of the analog output voltage, by controlling connection to one of a first and second reference voltage in response to a range control signal, the first converter section comprising a first resistor connected at a first end to an analog output voltage node and connected at a second end to one of the first and second reference voltages in response to the range control signal; and a second converter section for changing the analog output voltage by controlling connection to the one of the first and second reference voltage in response to the digital input signal for directing voltage conversion, the second converter section comprising a resistor array in which a plurality of resistors are arranged in parallel, a first end of each of the resistors of the array being connected to the analog output voltage node and a second end of each of the resistors being connected to one of the first reference voltage and the second reference voltage in response to the digital input signal.

2. The digital-to-analog converter of claim 1, wherein the first converter section comprises a switch unit for determining whether the second end of the first resistor is to be connected to the first reference voltage or the second reference voltage, in response to the range control signal.

3. The digital-to-analog converter of claim 1, wherein the second converter section further comprises:

a decoder for decoding the digital input signal for directing voltage conversion; and a switch unit for determining whether the second end of each of the resistors is to be connected to the first reference voltage or the second reference voltage, in response to an output code of the decoder.

4. The digital-to-analog converter of claim 3, wherein each of the resistors within the resistor array has the same resistance.

5. The digital-to-analog converter of claim 3, wherein the resistors in the resistor array have binary-weighted resistances.

6. The digital-to-analog converter of claim 5, wherein the on-resistance of the switch unit is reduced according to a binary-weighted ratio of the resistors in the resistor array.

7. The digital-to-analog converter of claim 3, wherein the decoder is a binary-to-thermometer decoder in which the output code has a minimum code change.

8. A digital-to-analog converter for converting the voltage of a digital input signal into an analog output voltage, comprising:

a first converter section for determining a range of the analog output voltage, by controlling connection to one of a first and second reference voltage in response to a range control signal; and a second converter section for dividing the digital input signal into upper bit digital input signals and lower bit digital input signals, and changing the analog output voltage in response to the lower bit digital input signal with a first resistor array having a resistance that is a binary-weighted unit resistance and changing the analog output voltage in response to the upper bit digital input signal with a second resistor array comprising a plurality of resistors having the same unit resistances.

9. The digital-to-analog converter of claim 8, wherein in the second converter section, the resistors in the first resistor array are coupled to the first or second reference voltage in direct response to the lower bit digital input signal, and the resistors in the second resistor array are coupled to the first or second reference voltage in response to the output code of a decoder which responds to the upper bit digital input signal.

10. The digital-to-analog converter of claim 8, wherein in the second converter section, the resistors in the first resistor array are coupled to the first or second reference voltage in response to the output code of a decoder which responds to the lower bit digital input signal, and the resistors in the second resistor array are coupled to the first or second reference voltage in response to the output code of a decoder which responds to the upper bit digital input signal.

11. The digital-to-analog converter of claim 10, wherein the decoder is a binary-to-thermometer decoder in which the output code has a minimum code change.

12. The digital-to-analog converter of claim 9, wherein the decoder is a binary-to-thermometer decoder in which the output code has a minimum code change.

13. A digital-to-analog converter for converting the voltage of a digital input signal into an analog output voltage, comprising:

a first converter section for determining an output voltage range of an analog output port by controlling connection to one of a first and second reference voltage in response to a range control signal; and a second converter section for dividing the digital input signals into row-direction bit digital input signals and column-direction bit digital input signals, and changing the analog output voltage by resistor-switching cells which respond to the output code of a column decoder to decode the column-direction bit digital input signal and the output code of a row decoder to decode the row-direction bit digital input signal.

14. The digital-to-analog converter of claim 13, wherein each of the column decoder and the row decoder is a binary-to-thermometer decoder in which the output code has a minimum code change.

15. The digital-to-analog converter of claim 13, wherein each of the resistor-switching cells comprises:

a local decoder responsive to the output codes of the column decoder and row decoder;

a resistor coupled to the analog output voltage; and a cell switch unit for connecting the resistor to the first or second reference voltage in response to the output of the local decoder.

16. The digital-to-analog converter of claim 13, wherein each of the resistor-switching cells has a matrix structure in which the cells are arranged in rows and columns in accordance with the number of output codes of the row decoder and the number of output codes of the column decoder.

* * * * *